United States Patent
An et al.

[19]

[11] Patent Number: 6,033,135
[45] Date of Patent: Mar. 7, 2000

[54] DEVELOPMENT SYSTEM FOR MANUFACTURING SEMICONDUCTOR DEVICES, INCLUDING A CONTAINER EQUIPPED WITH CLEANING AND VENTILLATION APPARATUS, AND CONTROLLING METHOD THEREOF

[75] Inventors: Woung-kwan An, Inchon; Dong-ho Kim, Kyungki-do, both of Rep. of Korea

[73] Assignee: Samsung Electronics Co., Ltd., Suwon, Rep. of Korea

[21] Appl. No.: 09/206,232

[22] Filed: Dec. 7, 1998

[30] Foreign Application Priority Data

Dec. 24, 1997 [KR] Rep. of Korea ............... 97-73507

[51] Int. Cl.[7] ........................................ G03D 5/00
[52] U.S. Cl. .................. 396/611; 396/612; 396/627; 118/52; 134/902
[58] Field of Search .................. 396/611, 612, 396/625, 627; 118/52, 53, 56, 409; 134/902; 430/329; 427/96, 240

[56] References Cited

U.S. PATENT DOCUMENTS 4,590,094  5/1986  Ringer ............................ 427/82
4,851,263  7/1989  Ishii et al. ....................... 427/240
5,650,196  7/1997  Muhlfriedel et al. ............ 427/240
5,930,549  7/1999  Kim et al. ........................ 396/611

*Primary Examiner*—Alan A. Mathews
*Attorney, Agent, or Firm*—Jones Volentine, LLP

[57] ABSTRACT

A development system for manufacturing semiconductor devices uses a container to easily remove by-products of development from a wafer by: soaking the wafer in the developer with the pattern face downward; spraying rinse onto the pattern face from below; rotating the wafer at high speed to remove the rinse and by-products; and then cleaning and ventilating the container so that the developer, rinse, cleaning solution and development by-products are removed from the container. No by-products are left in the corners of the pattern of the pattern face, because the development and rinse are performed with the pattern facing downward. No by-products, developer, rinse or cleaning solution contaminate the wafer, because steps of the process are performed in an enclosed container which is cleaned and ventilated between development of each wafer.

44 Claims, 13 Drawing Sheets

DEVELOPMENT SYSTEM FOR MANUFACTURING SEMICONDUCTOR DEVICES, INCLUDING A CONTAINER EQUIPPED WITH CLEANING AND VENTILLATION APPARATUS, AND CONTROLLING METHOD THEREOF

BACKGROUND OF THE INVENTION

1. Field of the Invention

The present invention relates to a development system for manufacturing semiconductor devices, including a container equipped with cleaning and ventilation apparatus, and a controlling method thereof. More particularly, the present invention relates to a development system for manufacturing semiconductor devices, in which a wafer is immersed in developer and the developer is rinsed from the wafer within a container, thereby easily removing the reaction by-products generated on the wafer during development, and allowing cleaning of the container after development of the wafer.

2. Background of the Related Art

Generally, semiconductor devices are manufactured by repeatedly carrying out various processes such as photo lithography, etching, a thin-film formation process, etc., in which photo lithography is a process of forming various patterns on a wafer.

The photo lithography process generally comprises uniformly depositing photo resist on the wafer; irradiating the wafer with light such as ultraviolet rays; and developing the exposed or unexposed portion.

FIG. 1 shows a spin chuck used in the conventional development process in photo lithography as described above, in which the wafer W going through the exposure is mounted on the spin chuck 2, and the wafer is adsorbed and fixed on the spin chuck 2 by vacuum pressure supplied from the lower side of the spin chuck 2.

Then, a certain amount of developer is deposited on the wafer, and the spin chuck 2 is rotated 2 or 3 times at low speed such that the developer spreads uniformly over the wafer. A certain pattern is formed on the wafer when an exposed portion of the photoresist reacts with the developer in case of positive photoresist, or an unexposed portion of the photoresist reacts with the developer so as to be dissolved in case of negative photoresist.

After a certain time, rinse is sprayed on the wafer and the by-products (a) generated by the above dissolution are removed. Then, the solution and water remaining on the wafer surface are completely removed by rotating the spin chuck 2 at high speed thereby completing the development.

However, the conventional method described above has a problem in that by-products (a) remain in the corner of the pattern and on some portions of the wafer because the development is carried out on the wafer with its front-side having the pattern thereon facing upwardly, and the by-products (a) are incompletely removed by the high-speed rotation of the wafer.

Therefore, mal-functioning and generation of inferior wafers occur in the subsequent etching process due to the presence of by-products (a) that were not completely removed.

SUMMARY OF THE INVENTION

The present invention is directed to providing a development system for manufacturing semiconductor devices and a method of controlling thereof for completely removing the by-products produced in the development process so as to prevent mal-functioning in the subsequent process, which development system and control method substantially overcome one or more of the problems due to the limitations and the disadvantages of the related art.

Another object of the present invention is to provide a development system for manufacturing semiconductor devices and a method of controlling thereof for completely removing the by-products remaining inside a container which is washable.

To achieve these and other advantages and in accordance with the purpose of the present invention, as embodied and broadly described, a development system for manufacturing semiconductor devices comprises: a container for containing a developer therein with an opening on its upper side for wafer passage and a discharge outlet on its lower side; a wafer transfer apparatus for moving a wafer into and out of the container by adsorbing the back side of the wafer such that a pattern surface of the wafer is facing downward through the opening in the container; a developer supply means for supplying developer into the lower side of the container in order to soak the pattern surface of the wafer in the developer; a rinse supply means for supplying rinse into the container in order to spray the rinse onto the pattern surface of the wafer; a cleaning solution supply means for supplying a cleaning solution to the container in order to remove the developer and the rinse remaining in the container; and a gas supply means for supplying gas into the container in order to blow out the cleaning solution remaining in the container.

In addition, preferably, the container has a container cover on its upper side, which is formed of semitransparent material with an opening large enough for wafer passage, and the container is constructed such that a movement line of a spin chuck upon which the wafer is fixed is aligned with a center of the container, and a concavity is formed at a center of the lower side of the container so as to hold developer, whereby a pattern surface of the wafer is immersed into the developer.

The concavity of the container has a first discharge outlet connected to a first discharge line so as to selectively discharge the developer and the rinse, and a valve driven by hydraulic pressure is installed on the discharge outlet so as to open and close the discharge outlet, and an inclined groove is formed around a periphery of the concavity with a high point separating the inclined groove from the concavity, and a second discharge outlet is formed on the bottom of the inclined groove so that the developer and the rinse induced into the inclined groove are discharged through the second discharge outlet to a second discharge line.

In addition, the developer supply means comprises: a developer inlet installed on the lower side of the container so as to supply developer into the concavity of the container such that the pattern surface of the wafer is soaked in the developer; a developer storage tank connected to the developer inlet via a developer supply line; and a pump for supplying the developer from the developer storage tank into the container.

The rinse supply means comprises: a plurality of spray openings for spraying rinse onto the pattern surface of the wafer; a rinse supply source for supplying the rinse to the spray openings via a rinse supply line; and a valve installed on the rinse supply line so as to selectively open and close the rinse supply line.

The spray openings are formed on the upper side of the square-shaped rinse spray arm, which is driven by a motor so as to access all of the pattern surface of the wafer in order to spray rinse thereon, whereby the motor drives the rinse spray arm step by step, the rinse spray arm is connected to a rotation pipe which is connected to and rotated by the motor, and the rinse spray arm is connected to the rinse supply line so as to receive rinse.

In addition, preferably, the cleaning solution supply means comprises: a plurality of spray nozzles installed on the upper side of the container; a cleaning solution supply source supplying the cleaning solution to the spray nozzles via a cleaning solution supply line; and a valve installed on the cleaning solution supply line so as to selectively open and close the cleaning solution supply line.

In addition, the gas supply means comprises: a plurality of ventilation openings installed in the container in order to blow out the cleaning solution remaining in the container; a gas supply source for supplying gas under pressure to the ventilation openings via a ventilation line; and a valve installed on the ventilation line so as to selectively open and close the ventilation line.

In addition, the ventilation openings are formed on the lower side of the square-shaped ventilation arm which is driven by a motor so as to access the concavity of the container to spray gas thereon, a motor drives the ventilation arm step by step, the ventilation arm is connected to the rotation pipe which is connected to and rotated by the motor, and the ventilation arm is connected to the ventilation line so as to receive gas.

The gas supply means comprises: an adsorbing pipe installed on the container for adsorbing by-products and moisture remaining in the container blown out by gas from the ventilation openings; and a vacuum pump installed on the adsorbing pipe so as to maintain low pressure in the adsorbing pipe.

The developer supply means, the rinse supply means, and the gas supply means are all carried through one pipe which penetrates the container, and preferably, the pipe is a bearing-supported rotation pipe having a pulley on its one end and being rotated by the rotation force supplied via a belt from the motor.

In another aspect, a controlling method of a development system for manufacturing semiconductor devices comprises the steps of: a) supplying a developer into a container; b) lowering a wafer into the container and into the developer with the pattern surface of the wafer directed downwardly; c) developing the wafer by soaking the pattern surface of the wafer in the developer; d) raising the wafer out of the developer; e) rinsing the wafer by spraying rinse upwardly onto the pattern surface of the wafer to remove by-products of development from the pattern surface; f) removing the wafer from the container; g) cleaning the container by spraying a cleaning solution into the container; and h) supplying gas into the container in order to remove the cleaning solution remaining in the container.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which.

Figure 1:
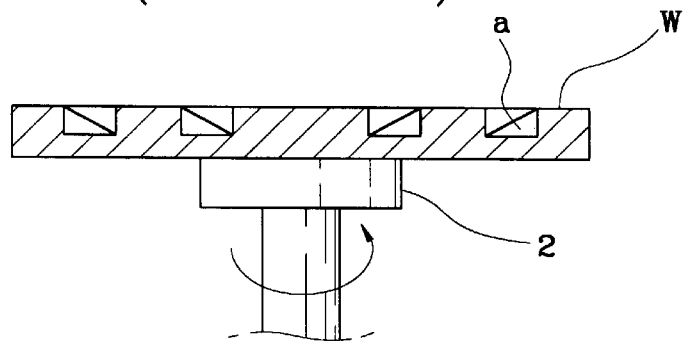
FIG. 1 shows a spin chuck used in a conventional development process.
Figure 2:
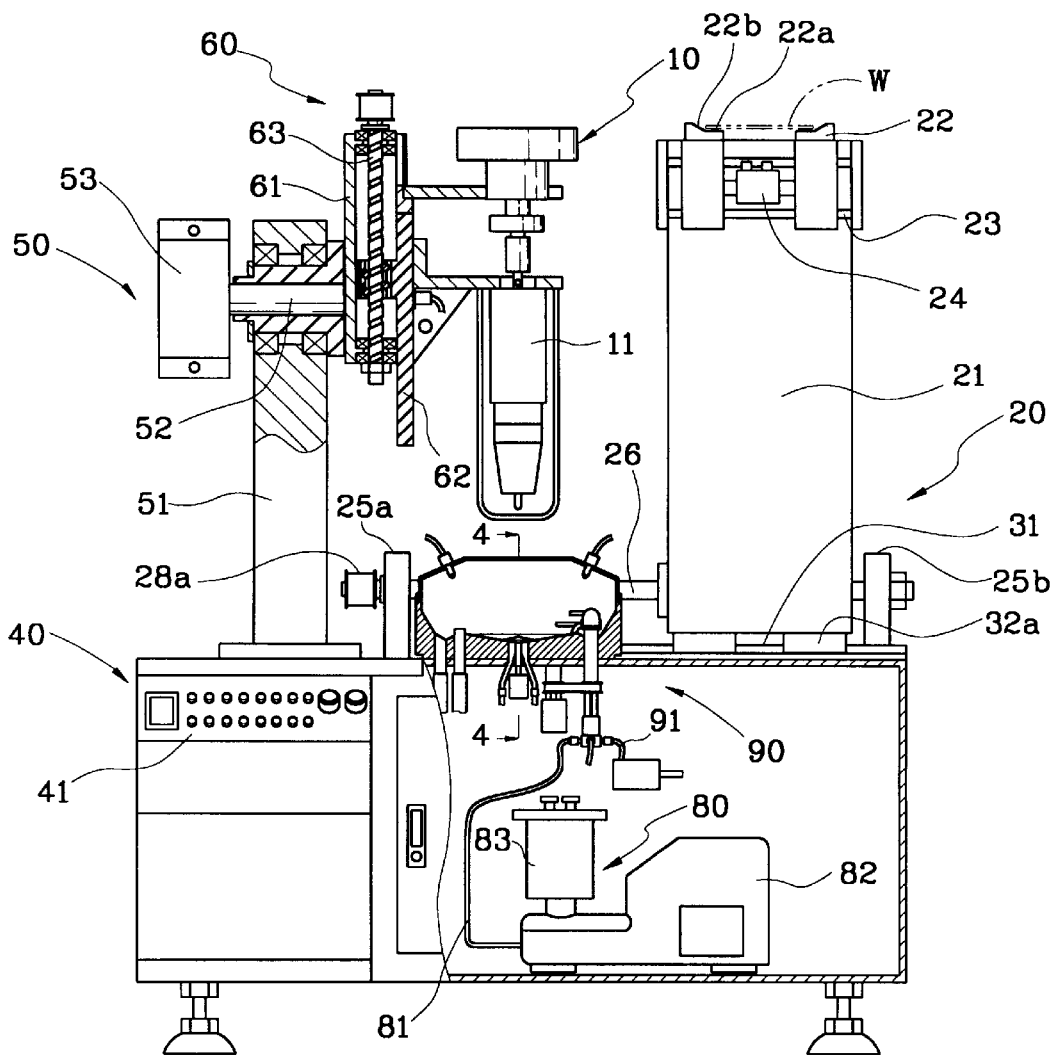
FIG. 2 is a side view of the development system according to the present invention.
Figure 12:
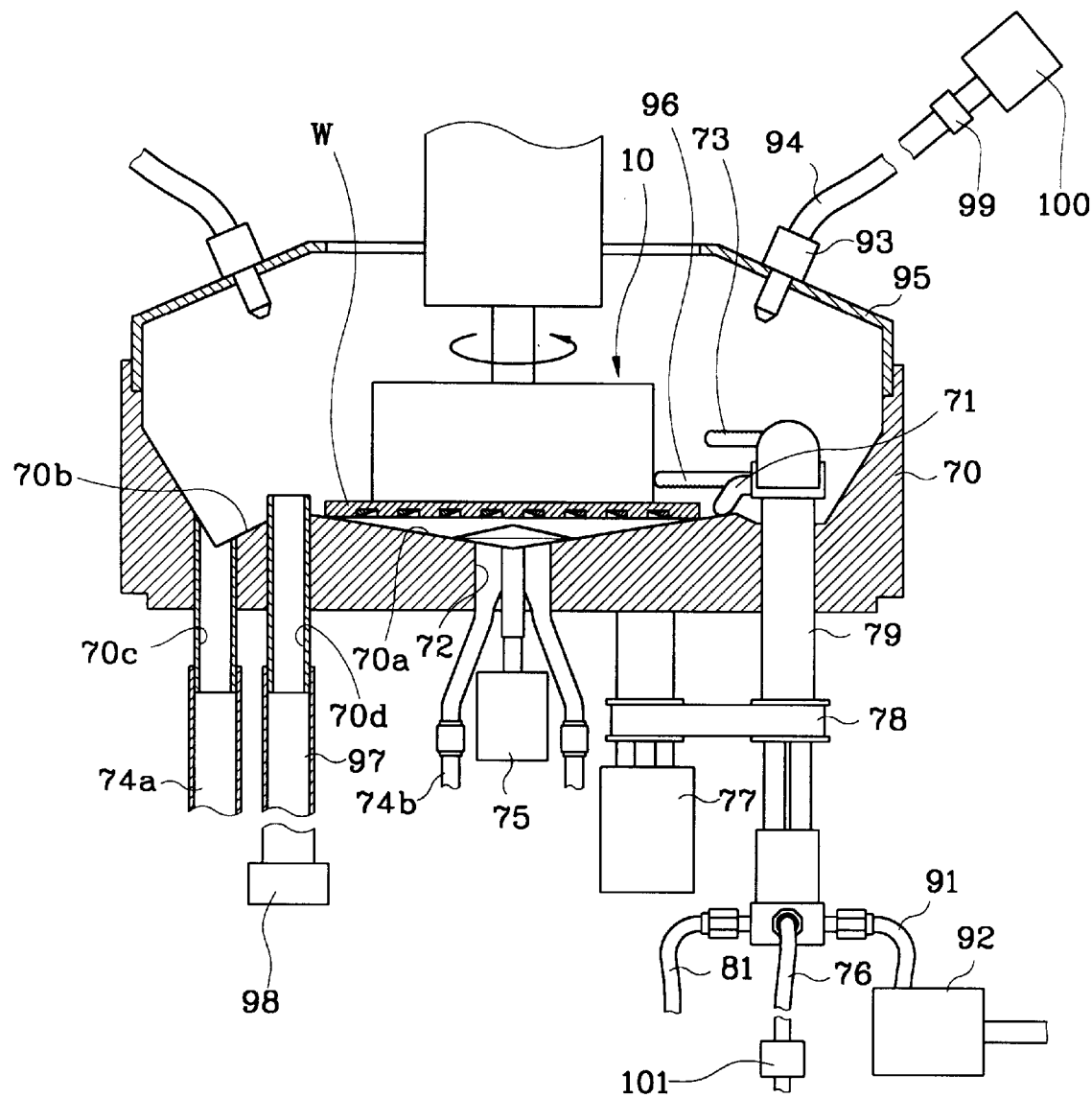
Figure 13:
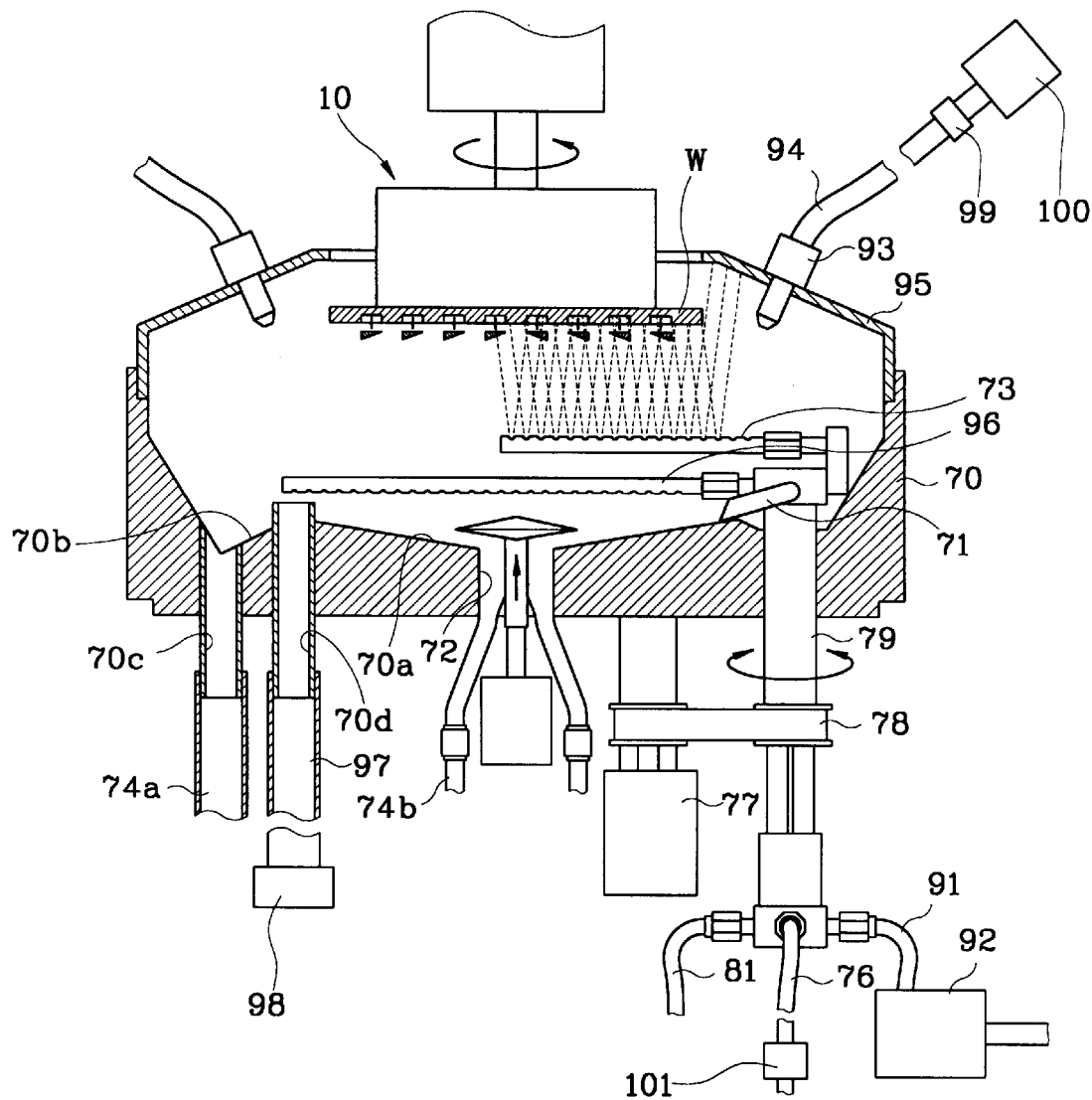
Figure 14A:
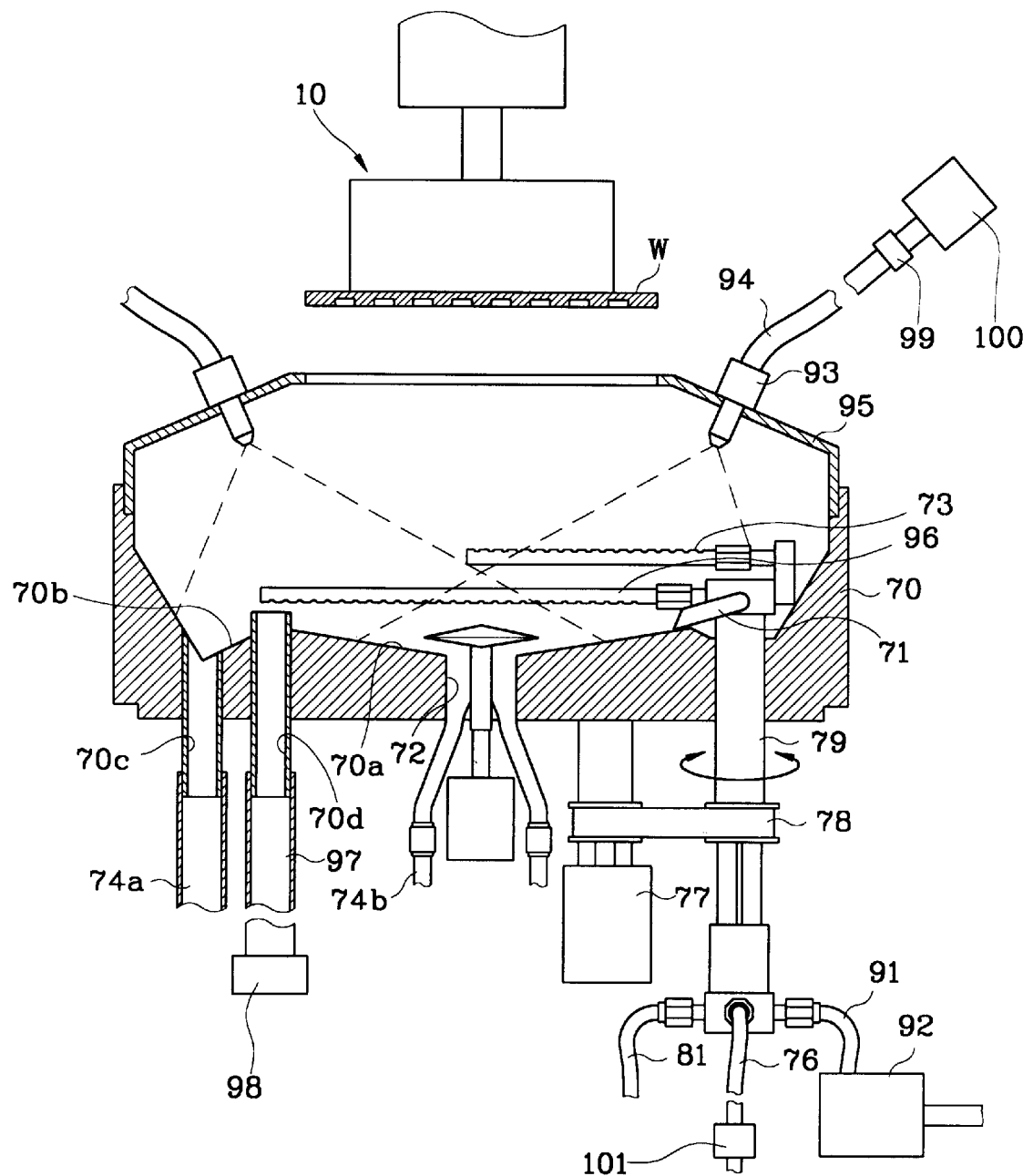
Figure 14:
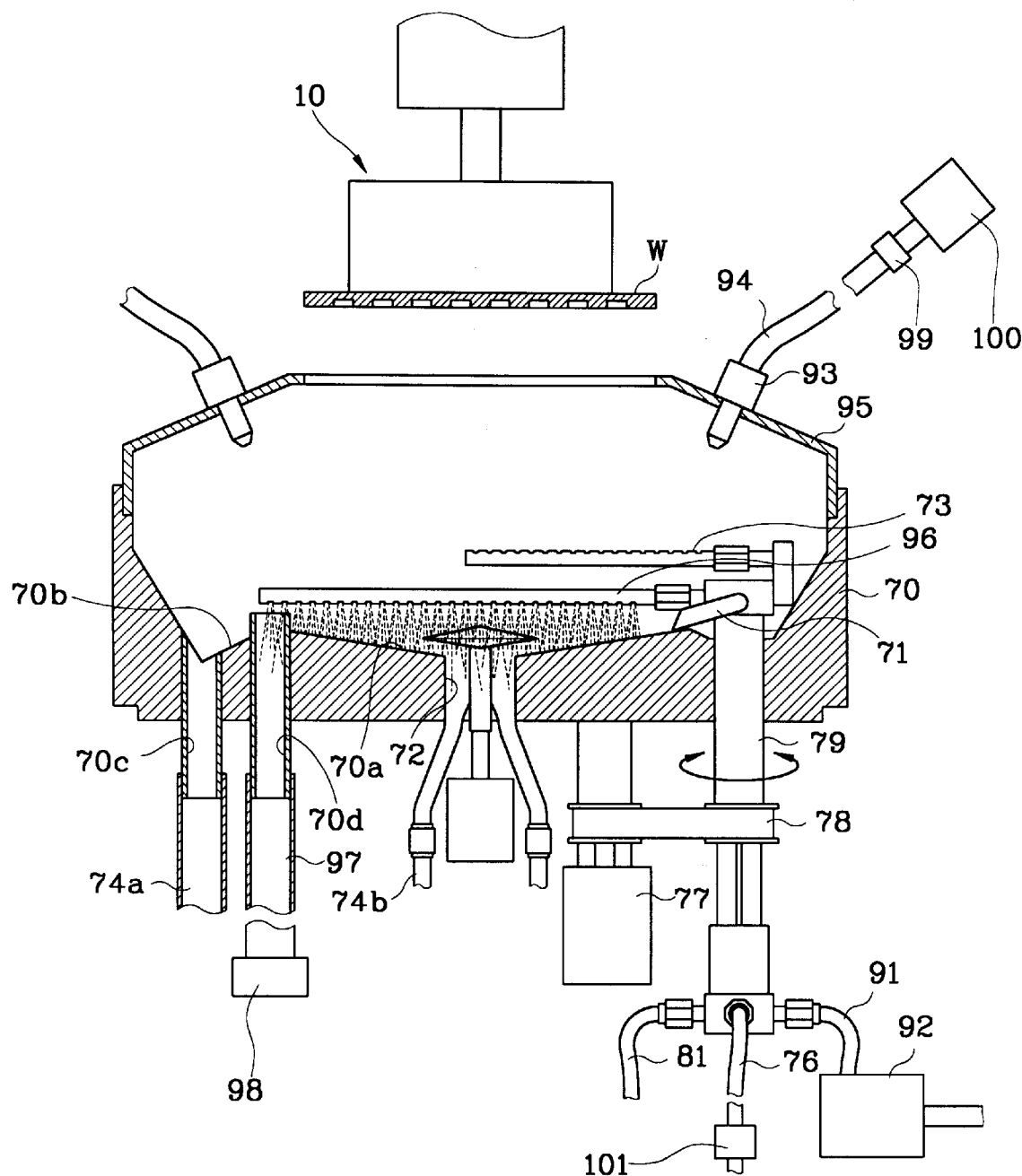
Figure 15:
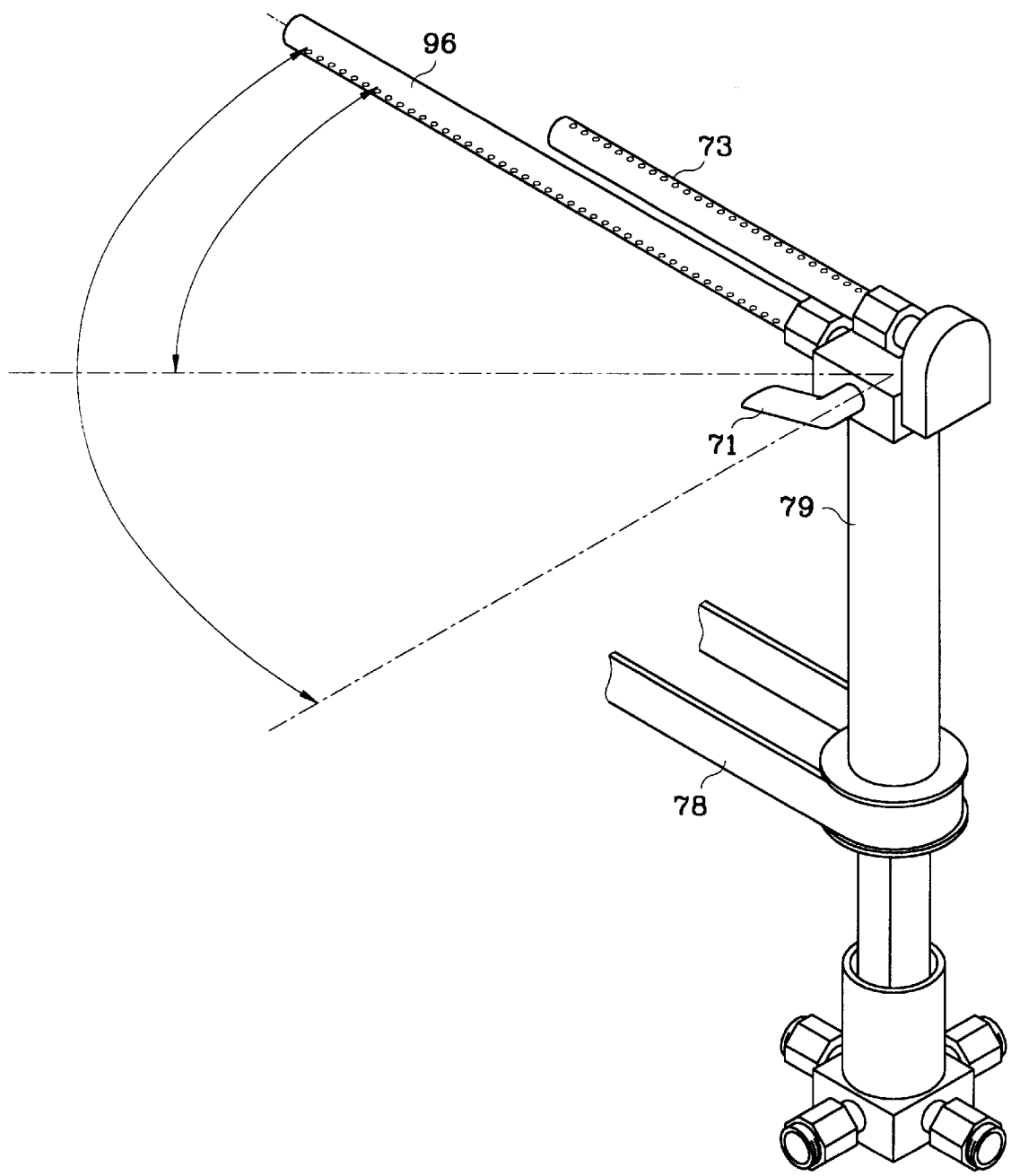

FIGS. 12, 13, 14a, and 14b illustrate the development process by the developer supply part and the rinse supply part of the development system of FIG. 2; and FIG. 15 is a perspective view showing the rotation pipe shown in FIG. 12.

DETAILED DESCRIPTION OF PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art.

Portions of the present invention are disclosed in co-pending, commonly-assigned, U.S. patent application Ser. No. 08/969,578, filed on Nov. 13, 1997, now U.S. Pat. No. 5,930,549. Details of these portions (spin chuck 10, wafer aligning part 20, reverse-driving part 50 and vertical driving part 60) of the present invention are also included below for completeness.

Figure 3:
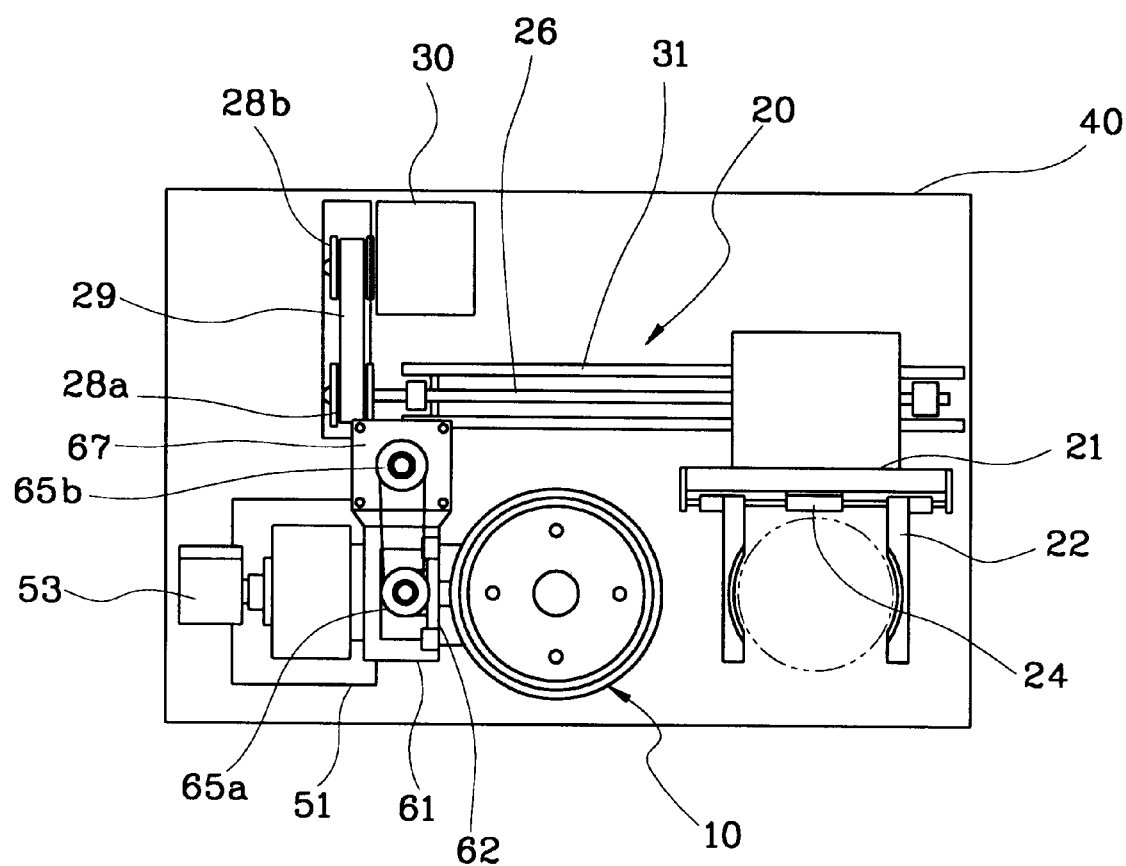
FIG. 3 is a top view of the development system of FIG. 2.
Figure 4:
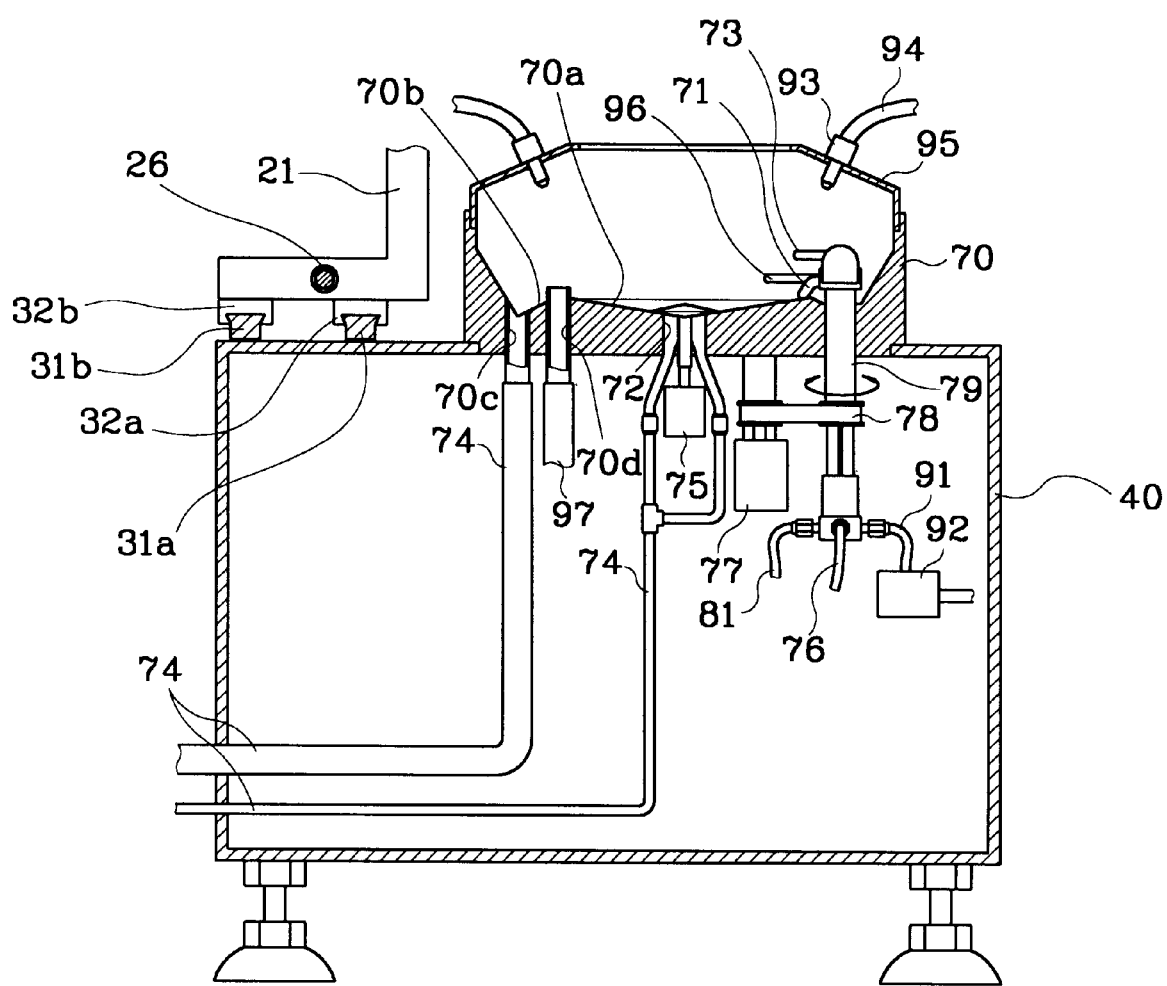
FIG. 4 is a cross-sectional view taken along the line 4—4 in FIG. 2.

Referring to FIGS. 2 to 4, the development system of the present invention comprises: a spin chuck 10 fixing a wafer; and a wafer aligning part 20 aligning the wafer such that the rotation center of the wafer matches with the rotation center of the spin chuck 10 before securing the wafer on the spin chuck 10.

The spin chuck 10 is rotatably driven at low or high speed by a driving motor 11, and the driving motor 11 preferably uses a step motor allowing easy control of rotation speed.

Figure 5:
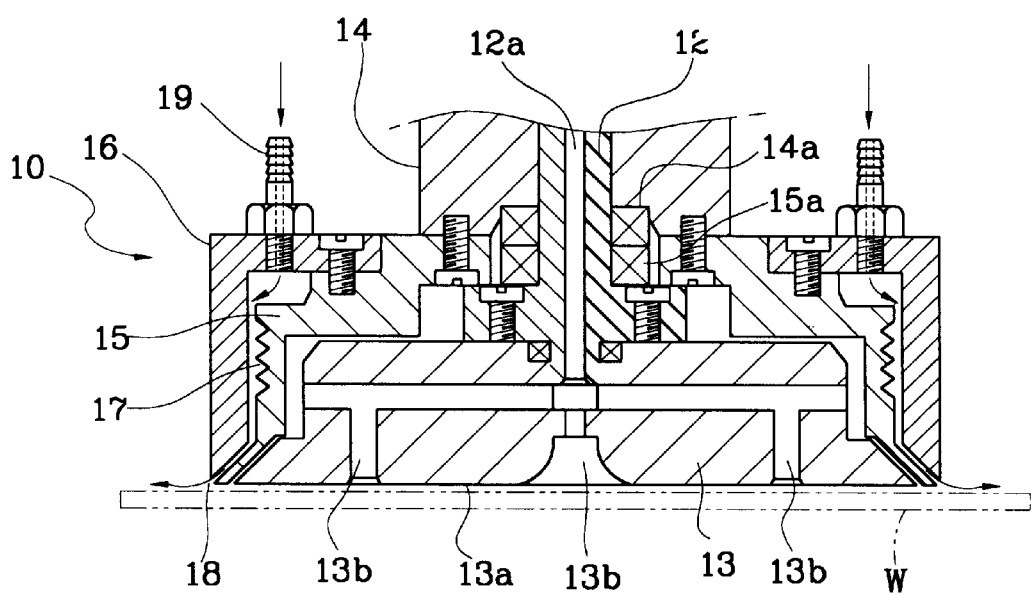
FIG. 5 is a cross-sectional view of the spin chuck of the development system shown in FIG. 2.

FIG. 5 shows the structure of the spin chuck 10, which comprises a rotation axis 12 being rotated by the driving motor 11, and a round-shaped adsorbing plate 13 fixed on the rotation axis 12 and rotating along with the rotation axis 12.

The rotation axis 12 comprises a vacuum passage 12a connected with an outer vacuum line (not shown), and the adsorbing plate 13 comprises a plurality of adsorbing holes 13b connected from the adsorbing surface 13a to the vacuum passage 12a of the rotation axis 12, wherein a wafer is vacuum-adsorbed by means of the adsorbing holes 13b and is secured on the adsorbing surface 13a. In addition, on the outside of the rotation axis 12, there is provided a boss 14 to fix the spin chuck 10 to a vertical driving part 60 to be described later. On the boss 14, there is fixed a housing 15 to cover the adsorbing plate 13 on its upper side.

Therefore, the spin chuck 10 is capable of rotating freely while being supported by the boss 14, the housing 15, and bearings 14*a*, 15*a*. In addition, on the spin chuck 10, there is provided a wafer contamination prevention means, which sprays inert gas at the edge of the back side of the vacuum-adsorbed wafer in order to prevent developer which is applied to the front side of the wafer during the development process from reaching the back side of the wafer.

The wafer contamination prevention means is constructed in such a manner that a cover 16 is provided spaced apart from the housing 15, a space 17 is formed between cover 16 and housing 15, the space 17 having an opening 18 on its lower side, and a gas supply line 19 is provided through the cover 16 in order to supply inert gas such as $N^2$ gas, etc. The gas supply line 19 delivers inert gas to the space 17, and sprays the inert gas through the opening 18 on the lower side. The opening 18 is formed along the peripheral edge of the adsorbing plate 13 in the circumferential direction so that the inert gas is uniformly sprayed over the edge of the back side of the wafer.

Figure 6:
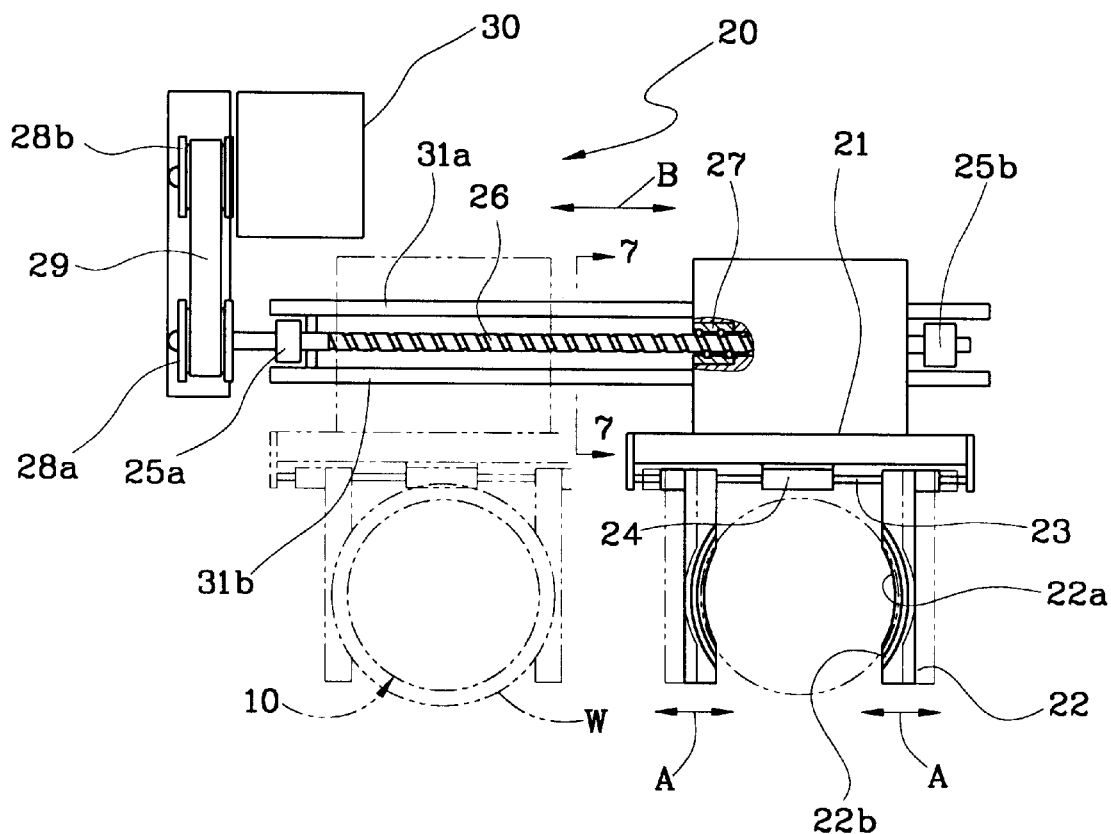
FIG. 6 is a top view of the wafer aligning part of the development system shown in FIG. 2.

As shown in FIGS. 2, 3 and 6, the wafer aligning part 20 is installed movably along a vertical frame 21 and a guide rod 23 over the vertical frame 21, and further comprises: a pair of fingers 22 aligning and holding the rotation center of the wafer; a rod cylinder 24 operable in both directions that is installed on the vertical frame 21 for driving the fingers 22 by air pressure; and a wafer transfer means for transferring the wafer such that the rotation center of the wafer aligned by the fingers 22 matches with the rotation center of the spin chuck 10.

The fingers 22 comprise: a support 22*a* with the wafer mounted thereon; and a guide surface 22*b* for aligning the rotation center of the wafer, wherein the guide surface 22*b* is preferably tilted such that the edge of the wafer is directed toward the support 22*a* during wafer mounting.

The fingers 22 are movably installed along the guide rod 23 fixed on the vertical frame 21, and if the wafer is placed on the support 22*a* with the fingers 22 open as shown in the dotted lines to the right in FIG. 6, the rod cylinder 24 drives the fingers 22 as shown by the arrows A and moves the fingers to the location shown by the solid lines so that the rotation center of the wafer is automatically aligned and firmly secured without shaking.

The wafer transfer means moves the vertical frame 21 having fingers 22 horizontally as shown by the arrow B in FIG. 6, and so the wafer fixed on the fingers 22 is moved onto the spin chuck 10. The wafer transfer means comprises a ball screw 26 rotation-supported by fixing parts 25*a*, 25*b*. A ball bearing 27 fixed on the vertical frame 21 moves back and forth in the longitudinal direction of the ball-screw 26 according to rotation of the ball screw 26.

In addition, the ball screw 26 is rotated clockwise or counter-clockwise by a driving motor 30, the driving force is transferred through a pair of pulleys 28*a*, 28*b* and a belt 29, and the driving motor 30 is controlled by the precisely-preset moving length such that the rotation center of the wafer aligned by the fingers 22 matches with the rotation center of the spin chuck 10.

Figure 7:
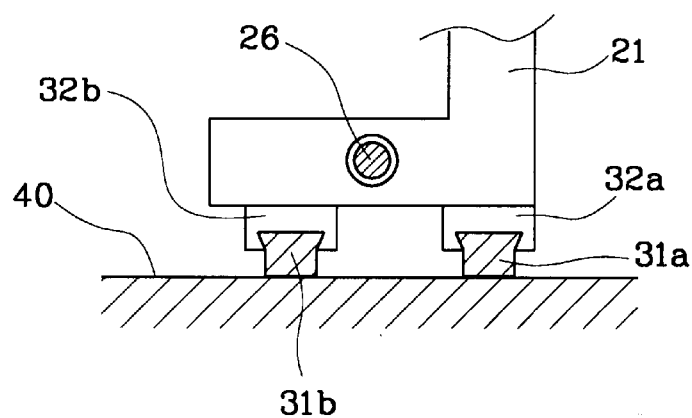
FIG. 7 is a cross-sectional view taken along the line 7—7 in FIG. 6.

As shown in FIGS. 6 and 7, the vertical frame 21 is guided along the ball screw 26 by a pair of guide rails 31*a*, 31*b* which are fixed on a table 40 parallel to each other on both sides of the ball screw 26, and by guide members 32*a*, 32*b* which are fixed on the bottom of the vertical frame 21 to slide along guide rails 31*a*, 31*b*. Guide rails 31*a*, 31*b* and guide members 32*a*, 32*b* are coupled, and the sectional shape of the coupling is formed as a triangle so that deviation and shaking of vertical frame 21 is prevented during its movement.

Figure 8:
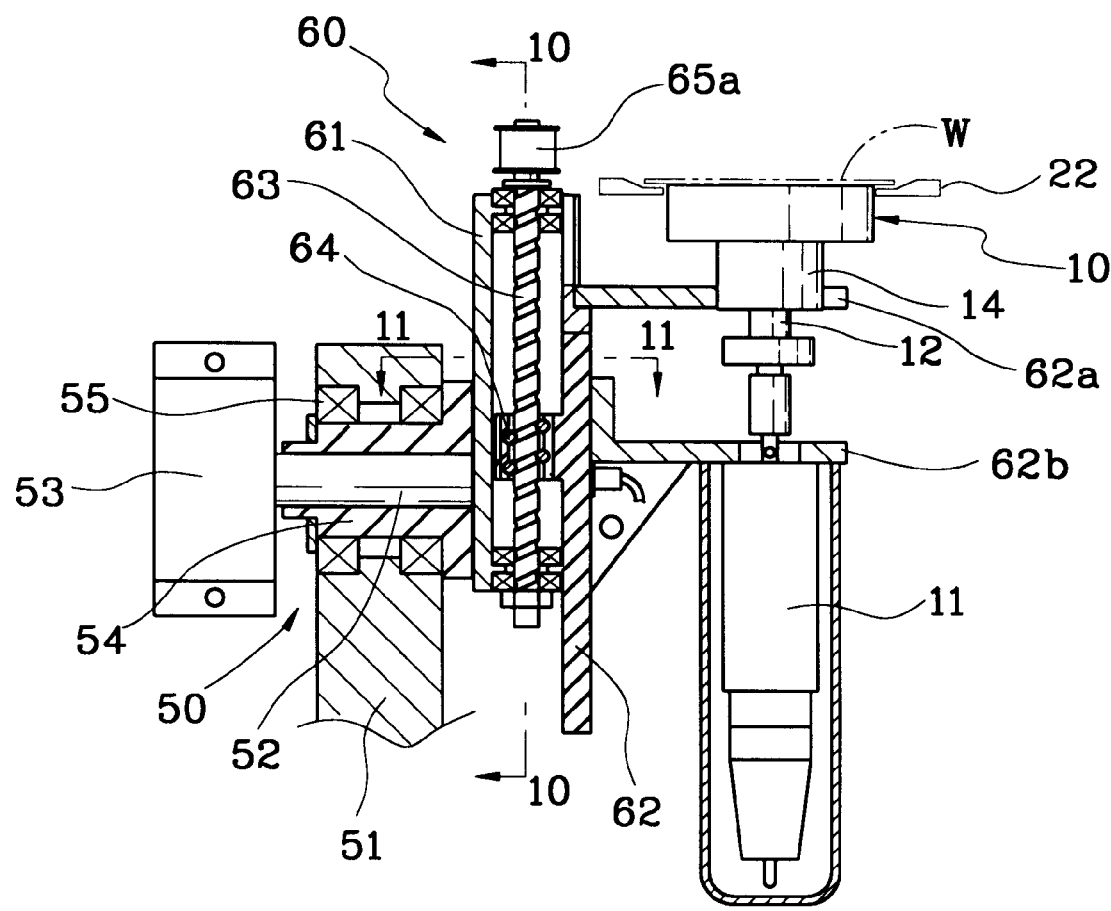
FIGS. 8 and 9 are front views of the reverse-driving part and the vertical driving part of the development system of FIG. 2.
Figure 9:
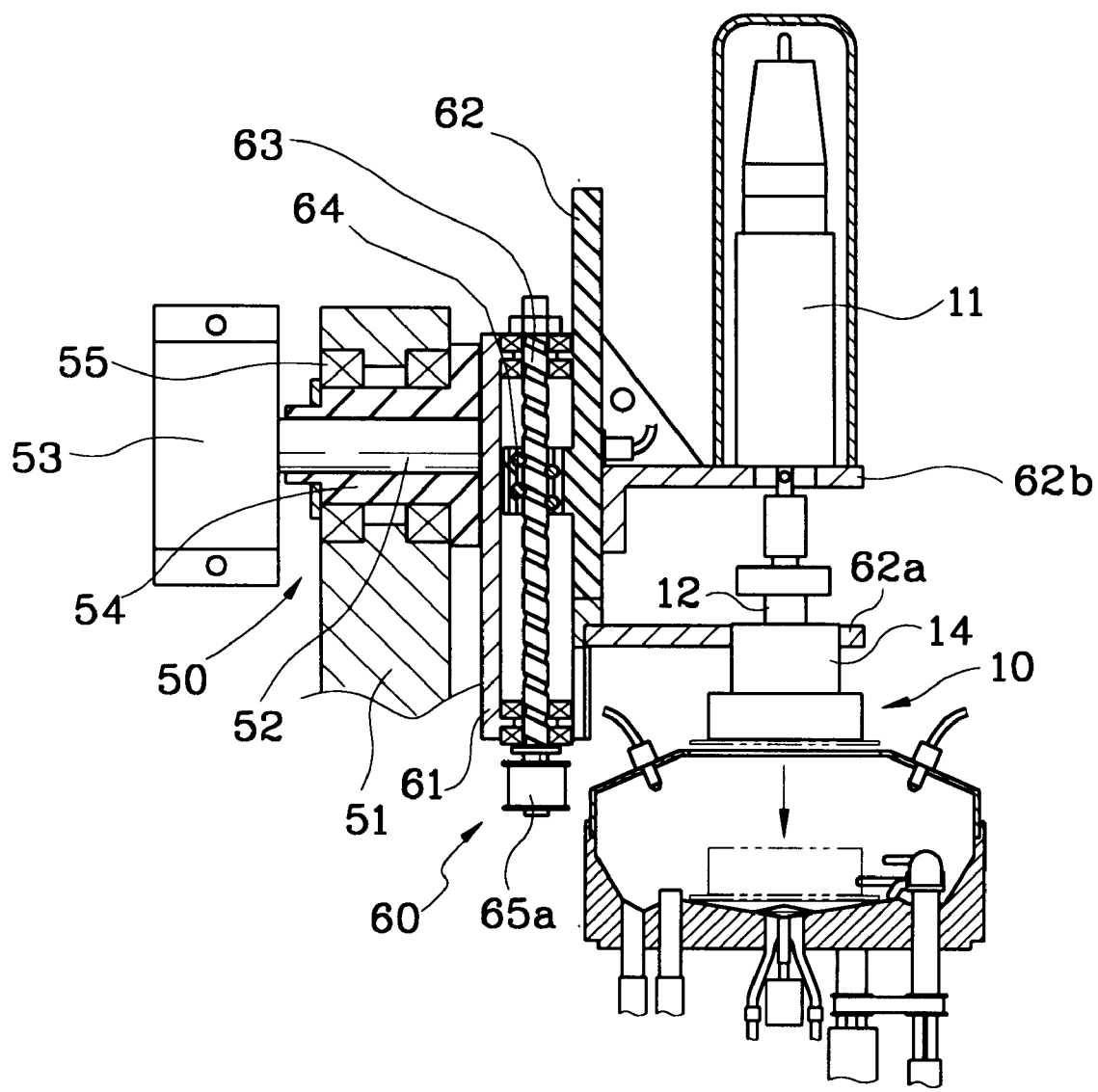

In addition, the development system of the present invention as shown in FIG. 2, FIG. 8 and FIG. 9, comprises: a reverse-driving part 50 for rotating the wafer that is moved from the wafer aligning part 20 and fixed on the spin chuck 10 such that the pattern surface of the wafer is directed upwardly or downwardly; and a vertical driving part 60 for vertically moving the spin chuck 10 having the wafer fixed thereon.

The reverse-driving part 50 comprises: a fixing frame 51 installed on the table 40; and a driving means installed on the fixing frame 51 for rotating a driving axis 52 clockwise or counter-clockwise through a certain angle. As for the driving means, it is preferable to use a rotary cylinder 53 that is driven by air pressure, and the clockwise and counter-clockwise rotation angle of the driving axis 52 by the rotary cylinder 53 is set at 180°.

In addition, a hub 54 is installed on the driving axis 52, and the hub 54 is rotatably supported by a bearing 55 of the fixing frame 51. The vertical driving part 60 is fixed on the hub 54.

The vertical driving part 60 comprises: a reverse-frame 61 fixed on the hub 54 of the reverse-driving part 50; a slide plate 62 movably-installed along the lengthwise direction of the reverse-frame 61; and a transfer means for vertically moving the slide plate 62. The boss 14 of the spin chuck 10 and the driving motor 11 are fixedly supported on the slide plate 62 by means of fixing brackets 62*a*, 62*b* as shown in FIG. 9.

The transfer means of the slide plate 62 is installed along the lengthwise direction of the reverse-frame 61, and it is provided with a ball screw 63 with both ends being rotatably supported by bearings. The ball bearing 64 fixed on one end of the slide plate 62 cooperates with the ball screw 63, and the ball bearing 64 moves back and forth along the lengthwise direction of the ball screw 63 according to the rotation of the ball screw 63.

Figure 10:
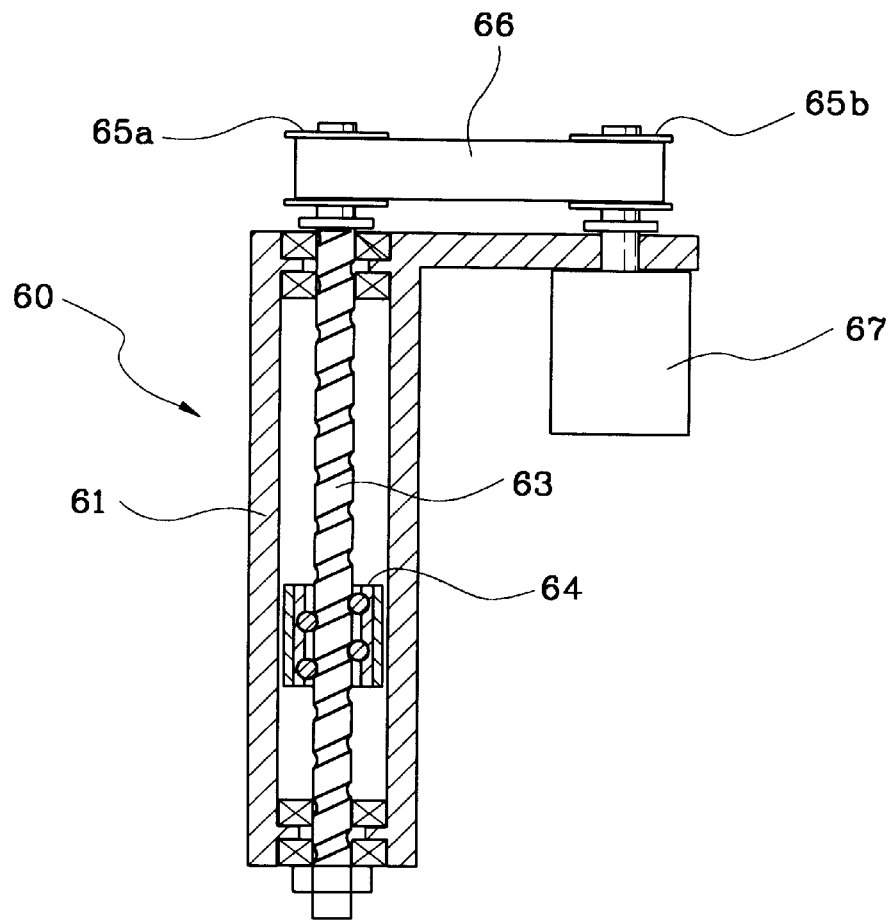
FIG. 10 is a cross-sectional view taken along the line 10—10 in FIG. 8.

In addition, the ball screw 63, as shown in FIG. 10, is constructed to rotate clockwise or counter-clockwise by means of a driving motor 67, wherein the driving force is transferred through a pair of pulleys 65*a*, 65*b* and a belt 66. The driving motor 67 preferably uses a step motor for easy control of the rotation speed.

At this stage, the moving distance of the spin chuck 10 is precontrolled such that the pattern surface of the wafer fixed on the spin chuck 10 contacts with developer inside a container 70.

Figure 11:
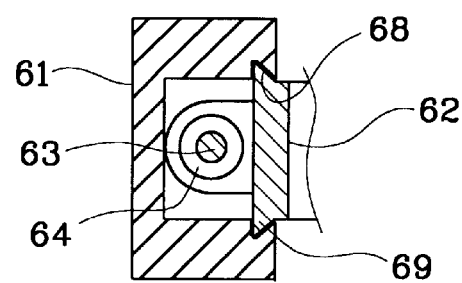
FIG. 11 is a cross-sectional view taken along the line 11—11 in FIG. 8.

The slide plate 62 cooperates with the reverse-frame 61 so as to be capable of moving in a straight line along the ball screw 63. As shown in FIG. 11, a guide rail groove 68 is formed in the open edges of reverse-frame 61 on both sides of the ball screw 63. In each of the guide rail grooves 68 there is coupled a guide protrusion 69, and these guide protrusions 69 are formed on side edges of the slide plate 62. The guide rail groove 68 and the guide protrusion 69 are coupled, and the coupling shape thereof is preferably formed as a triangle in order to prevent deviation or shaking of the slide plate 62 as it slides along reverse-frame 61.

In addition, as shown in FIG. 2 and FIGS. 12 to 15, a container 70 having developer therein is provided on the table 40. Inside the table 40, there are provided a developer supply part 80 for supplying a constant amount of developer inside the container 70; and a rinse supply part 90 for supplying rinse for spraying onto the pattern surface of the wafer.

On the upper side of the container 70, a container cover 95 of semi-transparent material has an opening formed therein large enough for a wafer to pass, and the center of the container 70 is aligned with the vertical movement line of the spin chuck 10.

In addition, on the bottom center of the container 70, a cone-shaped concavity 70a is formed in order to hold developer in which to soak the wafer. Around the concavity 70a, an inclined groove 70b is formed such that the by-products guided into the inclined groove 70b are discharged through a discharge opening 70c into a discharge line 74a. The inclined groove 70b is separated from the concavity 70a by a high point, and the discharge opening 70c in the inclined groove 70b is open so that by-products induced into the inclined groove 70b are discharged through discharge opening 70c by the force of gravity.

In addition, the container 70 comprises a discharge outlet 72 on the lower side of the concavity 70a, which is connected to a discharge line 74b so as to selectively discharge the developer and the rinse. A valve 75 is disposed on the discharge outlet 72 in order to selectively open/close the discharge outlet 72, the valve 75 being driven by hydraulic pressure.

In addition, the container 70 has a developer inlet 71 installed on the concavity 70a, which is connected with the developer supply part 80. That is, the developer inlet 71 is installed on a rotation pipe 79, and when a rinse spray arm 73 is in a rest position over the inclined groove 70b, the opening of the developer inlet 71 is in position to deliver developer to the concavity 70a. The developer inlet 71 is connected with a developer storage tank 82 by a developer supply line 81 of the developer supply part 80, as shown in FIG. 2 and FIGS. 12 to 14, and on the developer storage tank 82, a pump 83 is installed so as to supply a certain amount of the developer to the container 70.

The rinse spray arm 73 preferably has a square-shaped cross-section with spray openings on its upper side for spraying a rinse onto the rotating wafer being driven by a motor 77. In its operative position as shown in FIGS. 12–14b, the rinse spray arm is located close to the lower side of the wafer pattern surface so as to spray the rinse. In its rest position, the rinse spray arm is positioned away from the concavity 70a and over the inclined groove 70b, as shown in FIG. 12.

The spray openings are preferably fine penetrating spray openings. The rinse spray arm 73 is vertically connected with the rotation pipe 79 which is rotated by the motor 77 so that a horizontal driving angle of the rinse spray arm is controlled step by step so as to spray rinse while moving along the entire pattern surface of the wafer. Further, the rinse spray arm 73 is connected with a rinse supply part 90.

In addition, the rinse spray arm 73 is connected with a rinse manifold 92 via a rinse supply line 91 of the rinse supply part 90, and the rinse manifold 92 is connected to an outside rinse supply source (not shown) so as to receive a rinse from outside. Rinse is supplied to the rinse spray arm under pressure. Deionized water is preferably used as the rinse.

In addition, a control part 41 is provided on one side of the table 40 so as to control each of the above driving parts.

Meanwhile, the development system for manufacturing semiconductor devices of the present invention further comprises: a plurality of spray nozzles 93 installed on the upper side of the container 70, each spray nozzle 93 having a wide spray angle for selectively spraying a cleaning solution throughout the inside of and onto the entire bottom surface of the container 70, the cleaning solution being supplied via a cleaning solution supply line 94 from a cleaning solution source 100; and a valve 99 to open and close the cleaning solution supply line 94. A gas supply means is provided to blow out the cleaning solution remaining in the container 70 so as to discharge it. The cleaning solution is preferably deionized water.

The gas supply means comprises: a ventilation arm 96 vertically connected with the rotation pipe 79 and being rotated by the driving of the motor 77 and spraying gas while moving along the entire surface of the concavity 70a through a horizontal driving angle controlled step by step; and an adsorbing pipe 70d installed on the inclined groove 70b, connected with a gas adsorbing line 97 for adsorbing by-products and moisture remaining inside the container 70 by low pressure formed therein. Gas adsorbing line 97 is equipped with a vacuum pump 98 to maintain low pressure in the adsorbing line during container cleaning.

The ventilation arm is preferably formed with a square-shaped cross-section. A plurality of ventilation openings formed on the lower side of the ventilation arm are fine penetrating openings, and can be made having various shapes, such as a narrow slit, so as to form a gas screen. The opening of the adsorbing pipe 70d is preferably installed at the high point between the concavity 70a and the inclined groove 70b so as not to be contaminated by the developer discharged through discharge outlet 72.

The ventilation arm 96 is connected with a ventilation line 76 via the rotation pipe 79. A gas pump (not shown) supplies gas under pressure to the ventilation arm 96 via a ventilation line 76. A valve 101 is provided to open and close ventilation line 76.

The rotation pipe 79 is vertically driven by the rotation force of the motor 77 installed on the lower side of the container 70 and transferred to rotation pipe 79 by a belt 78. On the end of the rotation pipe 79 near the container 70 are located the rinse spray arm 73, the ventilation arm 96, and the developer inlet 71, as shown in FIG. 15. On the other end of the rotation pipe 79 distant from the container 70 is located a cross-connection line not affected by the rotation of the rotation pipe 79, as shown in FIGS. 12–14b. The ventilation line 76, the rinse supply line 91, and the developer supply line 81 are connected together at the cross-connection line.

A step motor, a geared motor, or a rotary motor, etc. are preferably used as the motor 77. In addition, the rinse spray arm is longer than the radius of the wafer. The ventilation arm is longer than the diameter of the concavity, as shown in FIG. 15, so as to spray gas over the entire surface of the concavity. The developer inlet is tilted toward the concavity such that the developer is supplied onto the concavity while the rotation pipe extends above the concavity. The rotation pipe is bearing-supported by the container. Meanwhile, the spray nozzle 93 and the motor 77 are controlled by the control part 41.

Operation and control of the development system for developing and rinsing wafers of the present invention are described below.

First, the rotation center of the wafer which is going through exposure is aligned, and the wafer is placed onto the spin chuck 10, as shown in FIGS. 2, 6, and 7. In particular, the wafer is placed on the support 22a with the fingers 22 of the wafer aligning part 20 open as shown in dotted lines on the right side of FIG. 6, the air rod cylinder 24 drives the fingers 22, and the fingers 22 move along the guide rod 23 as indicated by the arrows A in FIG. 6, so that the wafer is held and the rotation center of the wafer is automatically aligned.

Then, the ball screw 26 is rotated through a pair of pulleys 28a, 28b and the belt 29 by the driving motor 30 of the wafer aligning part 20, the ball bearing 27 is guided by the ball screw 26, and the guide member 32a, 32b of the vertical frame 21 are guided by the guide rails 31a, 31b so that the vertical frame 21 moves linearly and horizontally as indicated by the arrow B to the position shown in dotted lines in the center of FIG. 6, and the wafer is placed on the spin chuck 10.

The wafer is moved by a precise, preset distance as indicated by the arrow B, such that the rotation center of the wafer matches with the rotation center of the spin chuck 10, since the driving of the driving motor 30 is precisely controlled by the preset-program. When the wafer is placed on the spin chuck 10, the fingers 22 are opened again by the driving of the rod cylinder 24, and the spin chuck 10 adsorbs the back side of the wafer so that the wafer is secured on the spin chuck 10.

Then, the reverse-driving part 50 is driven to invert the wafer and the wafer transfer part from the position shown in FIG. 8 to the position shown in FIG. 9, wherein the pattern surface of the wafer which was facing upward is turned to face downward by the rotary cylinder 53 of the reverse-driving part 50 rotating the driving axis 52 by 180°. At the same time, the reverse frame 61 of the vertical driving part 60 and the slide plate 62 are rotated by 180°, and as shown in FIG. 9, the spin chuck 10 fixed on the slide plate 62 and the driving motor 11 are also rotated by 180°. As a result, the pattern surface of the wafer is directed downwardly, and is placed over the container 70.

Then, after being deposited on the wafer and forming the pattern, the exposed photoresist is partially dissolved when the wafer is lowered into the developer in the container 70, as shown in FIG. 2 and FIG. 12. The pump 83 of the developer supply part 80 is driven and the developer is pumped out of the developer storage tank 82. The pumped developer is supplied into the concavity 70a inside the container 70 via the developer supply line 81 and the developer inlet 71. At this stage, the amount of developer pumped and supplied by the pump 83 is set so as to supply enough developer to develop one wafer.

As shown in FIGS. 9 to 11, the ball screw 63 is rotated by the driving of the driving motor 67 of the vertical driving part 60 via a pair of pulley 65a, 65b and a belt 66, the ball bearing 64 is guided by the ball screw 63, and a guide protrusion 69 of the slide plate 62 cooperates with guide rail 68. The slide plate 62 moves straight downward as shown in FIG. 12, and the pattern surface of the wafer contacts the developer inside the concavity 70a of the container 70.

At this stage, since the distance the wafer moves is controlled such that the wafer is not completely soaked and only the pattern surface of the wafer contacts the developer, the driving of the driving motor 67 is controlled by the preset program, and the developer does not overflow to the back side of the wafer even though the back side of the wafer is horizontally aligned with the upper surface of the developer.

While the pattern surface of the wafer is being soaked in the developer, the driving motor 11 is driven so as to rotate the spin chuck 10 at low speed, about 10 to 300 rpm, and development is carried out for about 5 to 30 sec. During the development, as shown in FIG. 5, inert gas is supplied inside the spin chuck 10, and the inert gas is supplied to the bottom edge of the wafer via the opening 18 between the housing 15 and the lower side of the cover 16. In this way, overflowing of the developer onto the back side of the wafer due to rotation of the spin chuck 10 and contamination of the wafer are prevented.

Then, as shown in FIG. 13, the wafer W is moved upward out of contact with the developer in the concavity 70a, and the valve 75 is opened so that the developer can be discharged through discharge line 74b. At this time, motor 77 is driven so that rinse spray arm 73 is rotated into place under the wafer, and ventilation arm 96 is rotated into place over concavity 70a. Then rinse is sprayed over the entire pattern surface of the wafer by rinse spray arm 73 as the motor 77 drives the rinse spray arm 73 back and forth beneath the wafer. The by-products (a) of development are completely removed from the pattern surface of the wafer. During the rinse, the wafer is rotated slowly at a speed of 10 to 300 rpm for 5 to 30 seconds. Then the spray from rinse spray arm 73 is stopped.

After the rinse spray has stopped, any rinse remaining on the wafer is removed by the spin chuck 10 being rotated at high speed, at about 6000 to 7000 rpm, for about 30 to 90 sec. By the above removal operation, the moisture on the wafer is removed by the high speed rotation and centrifugal force. Since the pattern surface of the wafer is directed downwardly, the by-products (a) remaining thereof in the corners of the pattern flow easily downwardly. This by-products removal method is very efficient even for fine patterns. In addition, the adsorbing pipe 70d installed inside the container 70 adsorbs any moisture coming from the pattern surface of the wafer, in order to completely remove moisture from inside the container 70.

When the development, rinse, and moisture removal are completed, the wafer is removed from the container in the reverse direction as above, as shown in FIG. 14a. That is, the driving motor 67 of the vertical driving part 60 is reverse-driven, the spin chuck 10 and the wafer are moved upwardly, and the wafer is removed from the container 70. Then, the reverse-frame 61 is rotated at 180° by the rotary cylinder 53 of reverse-driving part 50, and as shown in FIG. 8, the wafer is placed on the fingers 22 of the wafer aligning part 20, and the pattern surface of the wafer is directed upwardly.

At this stage, the fingers 22 hold the wafer by the rod cylinder 24, the vacuum provided through the spin chuck 10 is turned off, and the wafer is released. Then, the vertical frame 21 is moved back into place by the driving of the driving motor 30, thereby completing the development.

After the wafer has been removed from the container, the spray nozzles 93 spray cleaning solution over the inside of the container, as shown in FIG. 14a. Then, as shown in FIG. 14b, the ventilation arm 96 sprays gas into the concavity 70a, and the vacuum pump 98 provides a vacuum pressure in adsorbing pipe 70d, so that any remaining cleaning solution is discharged from the container.

The development system of the present invention carries out the above operation repeatedly by the control part 41 provided on the table 40, and automatic control is possible by presetting the operation state of each of the driving parts.

According to the present invention, the development is easily carried out, and the by-products remaining in the corners of the pattern surface of the wafer are completely removed by carrying out the development with the pattern surface directed downwardly so that mal-functions due to the presence of by-products on the wafer in the subsequent process are prevented, thereby increasing the yield of production and improving productivity. In addition, a container is provided in which the development, rinse and moisture removal operations take place. The inside of the container is cleaned and ventilated after development of each wafer, so that developer, rinse and cleaning solution are removed therefrom.

Still further, while the present invention has been described in detail, it should be understood that various changes, substitutions and alterations can be made hereto without departing from the spirit and scope of the invention as defined by the appended claims.

What is claimed is:

1. A development system for manufacturing semiconductor devices comprising:
   a container for containing a developer therein with an opening on its upper side for wafer passage and a discharge outlet on its lower side;
   a wafer transfer apparatus for moving a wafer into and out of the container by adsorbing the back side of the wafer such that a pattern surface of the wafer is facing downward through the opening in the container;
   a developer supply means for supplying developer into the lower side of the container in order to soak the pattern surface of the wafer in developer;
   a rinse supply means for supplying rinse into the container in order to spray the rinse onto the pattern surface of the wafer;
   a cleaning solution supply means for supplying a cleaning solution into the container in order to remove the developer and the rinse remaining in the container; and
   a gas supply means for supplying gas into the container in order to blow out the cleaning solution remaining in the container.

2. The development system for manufacturing semiconductor devices of claim 1, wherein the container has a container cover on its upper side, which is formed of semi-transparent material with an opening large enough for wafer passage.

3. The development system for manufacturing semiconductor devices of claim 1, wherein the container is constructed such that a vertical movement line of a spin chuck upon which the wafer is fixed is aligned with a center of the container, and a concavity is formed at a center of the lower side of the container so as to hold developer, whereby a pattern surface of the wafer is immersed into the developer.

4. The development system for manufacturing semiconductor devices of claim 3, wherein the concavity is funnel-shaped with its center being low.

5. The development system for manufacturing semiconductor devices of claim 3, wherein the concavity has a first discharge outlet connected to a first discharge line so as to selectively discharge the developer and the rinse, and a valve driven by hydraulic pressure installed on the first discharge outlet so as to open and close the first discharge outlet.

6. The development system for manufacturing semiconductor devices of claim 3, wherein an inclined groove is formed around a periphery of the concavity with a high point separating the inclined groove from the concavity, the inclined groove having a second discharge outlet formed at a bottom thereof so that developer and rinse induced into the inclined groove are discharged through the second discharge outlet to a second discharge line.

7. The development system for manufacturing semiconductor devices of claim 6, wherein the second discharge outlet is an open discharge opening so as to naturally discharge the developer and the rinse by gravity.

8. The development system for manufacturing semiconductor devices of claim 1, wherein the wafer transfer apparatus comprises:
   a spin chuck movable into and out of the container, the back side of the wafer being fixed to the spin chuck;
   a driving motor for rotating the spin chuck;
   a vertical driving part for moving the wafer into and out of the container by vertically moving the spin chuck; and
   a reverse-driving part for selectively reverse-driving the wafer such that the pattern surface of the wafer is directed upwardly or downwardly by rotating the spin chuck and the vertical driving part.

9. The development system for manufacturing semiconductor devices of claim 8, wherein the spin chuck comprises:
   a rotation axis being rotated by the driving motor and having a vacuum passage therein;
   an adsorbing plate being fixed on and rotating together with the rotation axis, the adsorbing plate having a plurality of adsorbing holes connected with a vacuum passage within the rotation axis in order to vacuum-adsorb the wafer to a lower side of the adsorbing plate;
   a boss fixed on the vertical driving part for rotation-supporting the rotation axis; and
   a housing fixed on the boss and covering an upper side of the adsorbing plate.

10. The development system for manufacturing semiconductor devices of claim 9, the spin chuck further comprising a wafer contamination prevention means for spraying an inert gas onto peripheral edges of the wafer which is vacuum-fixed to the adsorbing plate.

11. The development system for manufacturing semiconductor devices of claim 10, wherein the wafer contamination prevention means comprises:
   a cover installed over the housing;
   a space formed between the cover and the housing, the space having an opening adjacent to the lower side of the adsorbing plate; and
   a gas supply line connected to the space in order to supply inert gas into the space such that the inert gas is sprayed through the opening.

12. The development system for manufacturing semiconductor devices of claim 3, wherein the developer supply means comprises:
   a developer inlet installed on the lower side of the container so as to supply developer into the concavity of the container such that the pattern surface of the wafer is soaked in the developer;
   a developer storage tank connected to the developer inlet via a developer supply line; and
   a pump for supplying the developer from the developer storage tank into the container.

13. The development system for manufacturing semiconductor devices of claim 1, wherein the rinse supply means comprises:
   a plurality of spray openings for spraying rinse onto the pattern surface of the wafer;
   a rinse supply source for supplying the rinse to the spray openings via a rinse supply line; and
   a valve installed on the rinse supply line so as to selectively open and close the rinse supply line.

14. The development system for manufacturing semiconductor devices of claim 13, the rinse supply means further comprising a manifold installed on the rinse supply line, the manifold receiving rinse from a rinse supply source and supplying the rinse under pressure to each of the spray openings.

15. The development system for manufacturing semiconductor devices of claim 13, wherein the spray openings are formed on an upper side of a square-shaped rinse spray arm which is driven by a motor so as to access all of the pattern surface of the wafer in order to spray rinse thereon, whereby the motor drives the rinse spray arm step by step, the rinse spray arm is connected to a rotation pipe which is connected to and rotated by the motor, and the rinse spray arm is connected to the rinse supply line so as to receive rinse.

16. The development system for manufacturing semiconductor devices of claim 13, wherein the spray openings are a plurality of fine penetrating openings.

17. The development system for manufacturing semiconductor devices of claim 15, wherein the rinse spray arm is longer than the radius of the wafer.

18. The development system for manufacturing semiconductor devices of claim 15, wherein the motor and the rotation pipe are connected via a pair of belts and pulleys.

19. The development system for manufacturing semiconductor devices of claim 1, wherein the cleaning solution supply means comprises:
a plurality of spray nozzles installed on the upper side of the container;
a cleaning solution supply source supplying the cleaning solution to the spray nozzles via a cleaning solution supply line; and
a valve installed on the cleaning solution supply line so as to selectively open and close the cleaning solution supply line.

20. The development system for manufacturing semiconductor devices of claim 19, wherein a plurality of spray nozzles are installed on the container cover, and each has a wide spray angle such that the cleaning solution is sprayed over an entire bottom surface of the container.

21. The development system for manufacturing semiconductor devices of claim 3, wherein the gas supply means comprises:
a plurality of ventilation openings installed in the container in order to blow out the cleaning solution remaining in the container;
a gas supply source for supplying gas under pressure to the ventilation openings via a ventilation line; and
a valve installed on the ventilation line so as to selectively open and close the ventilation line.

22. The development system for manufacturing semiconductor devices of claim 21, wherein the ventilation openings are formed on a lower side of a square-shaped ventilation arm which is driven by a motor so as to access the concavity of the container to spray gas thereon, a motor drives the ventilation arm step by step, the ventilation arm is connected to a rotation pipe which is connected to and rotated by the motor, and the ventilation arm is connected to the ventilation line so as to receive gas.

23. The development system for manufacturing semiconductor devices of claim 21, wherein the ventilation openings are a plurality of fine penetrating openings.

24. The development system for manufacturing semiconductor devices of claim 22, wherein the ventilation arm is longer than the diameter of the concavity of the container.

25. The development system for manufacturing semiconductor devices of claim 22, wherein the motor and the rotation pipe are connected via a pair of belts and pulleys.

26. The development system for manufacturing semiconductor devices of claim 21, wherein the gas supply source is a gas pump supplying gas under pressure.

27. The development system for manufacturing semiconductor devices of claim 21, wherein the gas supply means comprises:
an adsorbing pipe installed on the container for adsorbing by-products and moisture remaining in the container blown out by gas from the ventilation openings; and
a vacuum pump installed on the adsorbing pipe so as to maintain low pressure in the adsorbing pipe.

28. The development system for manufacturing semiconductor devices of claim 1, wherein the rinse and the cleaning solution are deionized water.

29. The development system for manufacturing semiconductor devices of claim 1, wherein the gas is an inert gas.

30. The development system for manufacturing semiconductor devices of claim 1, wherein the developer supply means, the rinse supply means, and the gas supply means are all carried through one pipe which penetrates the container.

31. The development system for manufacturing semiconductor devices of claim 30, wherein the pipe is a bearing-supported rotatable pipe having a pulley on its one end and being rotated by rotation force supplied via a belt from a motor.

32. The development system for manufacturing semiconductor devices of claim 31, wherein the motor is a step motor.

33. The development system for manufacturing semiconductor devices of claim 1, further comprising a wafer aligning means for aligning a rotation center of the wafer with a rotation center of the spin chuck.

34. A controlling method of a development system for manufacturing semiconductor devices comprising steps of:
a) supplying a developer into a container;
b) lowering a wafer into the container and into the developer with the pattern surface of the wafer directed downwardly;
c) developing the wafer by soaking the pattern surface of the wafer in the developer;
d) raising the wafer out of the developer;
e) rinsing the wafer by spraying rinse upwardly onto the pattern surface of the wafer to remove by-products of development from the pattern surface;
f) removing the wafer from the container;
g) cleaning the container by spraying a cleaning solution into the container; and
h) supplying gas into the container in order to remove the cleaning solution remaining in the container.

35. The controlling method of a development system of claim 34, wherein during step c), the wafer is rotated at a low speed for a preset time so as to react the wafer with the developer.

36. The controlling method of a development system of claim 35, wherein the wafer is rotated at 10 to 300 rpm for 5 to 30 sec.

37. The controlling method of a development system of claim 34, wherein after step e) and before step f), the wafer is rotated at high speed so as to remove the rinse and by-products from the wafer by centrifugal force.

38. The controlling method of a development system of claim 37, wherein the wafer is rotated at 6000 to 7000 rpm for 30 to 90 sec.

39. The controlling method of a development system of claim 34, wherein during step h), a vacuum pressure is applied to the container so as to adsorb the reaction gas or moisture inside the container and discharge it out of the container.

40. The controlling method of a development system of claim 34, wherein during step h), the gas is sprayed onto the cleaning solution remaining in the container by a moving ventilation arm so as to discharge the cleaning solution out of the container.

41. The controlling method of a development system of claim 34, the method further comprising the steps, prior to step a), of:

1) adsorbing a wafer onto a wafer transfer part with a pattern surface of the wafer directed upwardly; and
2) inverting the wafer and the wafer transfer part by 180° such that the pattern surface of the wafer fixed on the wafer transfer part is directed downwardly.

42. The controlling method of a development system of claim 34, wherein during steps b) and c), an inert gas is sprayed onto a peripheral edge of the wafer such that the developer does not flow over the peripheral edge and onto a back side of the wafer.

43. The controlling method of a development system of claim 34, wherein during step e), the wafer is rotated at a low speed of 10 to 300 rpm for 5 to 30 sec.

44. The controlling method of a development system of claim 34, wherein during step a), the developer supplied to the container is supplied in an amount to develop one wafer.

* * * * *